United States Patent [19]

Chang et al.

[11] Patent Number: 5,130,229

[45] Date of Patent: Jul. 14, 1992

[54] MULTI LAYER THIN FILM WIRING PROCESS FEATURING SELF-ALIGNMENT OF VIAS

[75] Inventors: Kenneth Chang, Hopewell Junction; George Czornyj, Poughkeepsie; Ananda H. Kumar, Hopewell Junction; Heinz O. Steimel, Fishkill, all of N.Y.

[73] Assignee: International Business Machines Corporation, Armonk, N.Y.

[21] Appl. No.: 514,982

[22] Filed: Apr. 26, 1990

[51] Int. Cl.⁵ .................. G03C 5/00; G03C 5/58; G03F 7/30

[52] U.S. Cl. ...................... 430/312; 430/313; 430/315; 430/319; 430/327; 430/328; 430/329; 430/394; 430/945; 156/643; 156/656; 156/659.1; 156/661.1

[58] Field of Search .............. 430/312, 315, 319, 313, 430/327, 328, 329, 394, 945; 156/643, 656, 659.1, 661.1

[56] References Cited

U.S. PATENT DOCUMENTS

| | | | |
|---|---|---|---|
| 4,307,179 | 12/1981 | Chang et al. | 430/314 |
| 4,702,792 | 10/1987 | Chow et al. | 156/628 |
| 4,774,127 | 9/1988 | Reagan et al. | 428/209 |
| 4,786,569 | 11/1988 | Rohde et al. | 430/14 |

FOREIGN PATENT DOCUMENTS

| | | |
|---|---|---|
| 0083020 | 7/1983 | European Pat. Off. |
| 0099544 | 2/1984 | European Pat. Off. |
| 0180101 | 5/1986 | European Pat. Off. |
| 0260857 | 3/1988 | European Pat. Off. |

OTHER PUBLICATIONS

IBM Technical Disclosure Bulletin, vol. 19, No. 3, 1976 by S. E. Greer, pp. 911-912.
Ohsaki, et al., "A Fine-Line Multilayer Substrate with Photo-sensitive Polymide Dielectric and Electroless Copper Plated Conductors", Third IEEE/CHMT International Electronic Manufacturing Technology Symposium, pp. 178-183, Oct. 12-14, 1987.
English language abstract of European Patent Application 0286854, published Apr. 1987.

Primary Examiner—Charles L. Bowers, Jr.
Assistant Examiner—Christopher G. Young
Attorney, Agent, or Firm—Ira David Blecker

[57] ABSTRACT

The present invention provides a packaging semiconductor structure and method for obtaining same. The structure is comprised of at least one level of dielectric and metallurgy layers. The at least one level is comprised of a wiring metallurgy plane and a "through-via" plane of interconnecting metallurgy in association with both one and two layers of polymeric dielectric materials. The self-alignment method of fabrication of the level provides a streamlined technique wherein stringent masking and alignment requirements are relaxed, undue processing such as at least one polishing step is eliminated and a structure having adhesive integrity is fabricated.

10 Claims, 1 Drawing Sheet

MULTI LAYER THIN FILM WIRING PROCESS FEATURING SELF-ALIGNMENT OF VIAS

BACKGROUND OF THE INVENTION

1. Field of the invention

The present invention relates to a process for forming multilayer wiring patterns on a substrate. More particularly, a self-aligned process is taught for fabricating polyimide overlayers having both wiring and interconnection metallurgy. Each layer fabricated in this manner is unique both in its structure and its integrity.

2. Description of the Prior Art

Semiconductor packaging technology has progressed beyond the simple sintered inorganic dielectrics having co-fired metallurgy, due to the speed and dimensional requirements of advanced devices. The use of thin metallized layers of organic dielectrics has become widely accepted as the solution addressing the new technological requirements. Ideally, an underlying substrate of standard sintered inorganic material provides the interconnection capability for mating with the next level of packaging (e.g. pins), the basic power supply wiring, and a metallized top surface for supporting multiple organic signal wiring layers. Structures have been proposed having as many as five (5) thin organic layers with associated signal metallurgy on the top surface of a sintered inorganic substrate. However, the fabrication of multilayer metallized organic structures is difficult to achieve using the processing techniques which are standard in the semiconductor and package processing industries.

Metallization is challenging due to the limitations of the lift-off techniques. In lift-off, the substrate is coated with a polymeric, radiation-sensitive layer (resist layer) which is subsequently patterned in such a manner as to expose the underlying substrate in those areas in which it is desired to deposit metallurgy. The metallurgy is then deposited over the exposed substrate areas and resist pattern. "Lift-off" occurs when the patterned resist material is dissolved, or otherwise removed, taking with it the undesired metallurgy and leaving the desired metal pattern. Deposition of the desired dielectric about the remaining metal and planarization of same is then required. The drawbacks of this fabrication technique include the high possibility of removal of the desired metallurgy with the resist and undesired metallurgy, particularly when the linewidths of desired metallurgy are very small. In addition, the patterning requires precise alignment in order to achieve metal deposition on, and thereby electrical connection to, the appropriate underlying areas on the substrate.

The metal deposition and removal technique of chemical-mechanical (or chem-mech) polishing has adequately addressed the concern of unnecessarily removing desired metallurgy at the same time as potentially eliminating the step of depositing the desired dielectric about the formed metal pattern. In chem-mech polishing, the polymeric, radiation-sensitive resist layer can be left in place as the dielectric material, if indeed it can act as an adequate insulator for the purposes of the electronic device. However, the difficulty of proper alignment to contact the underlying substrate is not addressed by the chem-mech method. Alignment is not only a processing challenge, but also limits the final structures. The common solution to alignment concerns is to overcompensate by depositing increasingly larger features with each subsequent layer in order to assure capture of the underlying feature. The result is a limitation on the number of layers due to this feature "growth" and electrical shorting concerns.

Further challenges to fabrication of a multilayer organic structure include adhesion of the polymeric material to both the associated metallurgy and the subsequently-deposited layers of polymeric material. The adhesion, the mechanical integrity and the electrical integrity of an organic layer can be influenced by the amount and type of processing to which it is exposed. Therefore, it is additionally desirable to minimize the processing of the multilayers in order not to compromise the properties of the materials and thereby the mechanical and electrical integrity of the structure.

In the past, the steps required for fabricating a level of organic packaging, as is herein defined as the wiring layer plus a via/interconnection layer, comprised the following steps:

(a) deposition of first organic resist layer;
(b) patterning the first organic resist layer through a fine featured mask (may include additional removal step depending upon patterning technique);
(c) deposition of wiring metallurgy on and about first patterned resist layer;
(d) removal of resist layer and excess overlying metal, leaving desired metal pattern;
(e) deposition of first insulative material on and about desired wiring metal pattern;
(f) removal of excess first insulative material on wiring metal;
(g) deposition of second organic resist layer;
(h) patterning of second resist layer through another fine featured mask (again, may require additional removal step);
(i) deposition of via metallurgy on and about second patterned resist layer;
(j) removal of second resist layer and overlying via metallurgy;
(k) deposition of second insulative material on and about via metallurgy; and
(l) removal of excess second insulative material from surface of via metallurgy.

The invention of chem-mech polishing, as referred to above and as is taught in Chow et al. U.S. Pat. No. 4,702,792, eliminates several steps of the process which is then consolidated into the following:

(a) deposition of first patternable insulation layer;
(b) patterning first insulation layer through fine feature mask (may include both patterning and removal steps);
(c) deposition of wiring metallurgy on and about first insulation layer;
(d) removal of excess metallurgy deposited on surface of first insulation layer by chem-mech polishing;
(e) deposition of second patternable insulation layer;
(f) patterning second insulation layer through fine featured mask (again, may include patterning and removal steps);
(g) deposition of via metallurgy on and about second patterned insulation layer; and
(h) removal of excess via metallurgy from the surface of the second insulation layer by chem-mech polishing.

The processing still requires detailed masks at each patterning step and two rigorous polishing steps. There is a need to further simplify the fabrication method to insure both ease and integrity of the resulting structure.

It is therefore an objective of the present invention to provide a method for fabricating multilayer metallized organic layers and to provide a resulting structure having good mechanical and electrical integrity.

It is a further objective of the subject invention to reduce the processing requirements for fabrication of a multilayer metallized organic structure.

It is yet another objective of the present invention to provide a "self-aligned" method for fabricating multilayer metal and organic structures to reduce alignment concerns therein.

It is another objective of the present invention to avoid the "growth" of features due to alignment concerns.

BRIEF DESCRIPTION OF THE INVENTION

These and other objectives are realized in the subject invention wherein a level of twice-metallized organic material is fabricated. The wiring and interconnection/via metallurgy are deposited in succession into the pattern openings of a first-deposited organic layer. For connection to fine features, the wiring metallurgy on the organic acts as a self-aligning mask for the later-deposited via metallurgy, and the combined height of the wiring and via metallurgy is the same as the height of the first-deposited organic. For connection to larger underlying metallurgy a blanket second organic layer is deposited and patterned over the large wiring metal features to provide a via hole for the later-deposited via metallurgy. The second organic layer is removed in all but those large feature areas prior to deposition of the via metallurgy. Polishing or machining to obtain a planar structure occurs after via metal deposition. The result is a level comprised of a wiring layer plus a via layer wherein the via layer is at least as finely featured as the wiring layer. Therefore, the undesirable "growth" of features due to alignment concerns is avoided. "Delamination" or separation of organic layers within the level is also eliminated since there is little organic-to-organic interface; and, since the organics bond well to the associated metallurgy.

The invention will be described in greater detail with reference to the accompanying drawings wherein.

Figure 4:
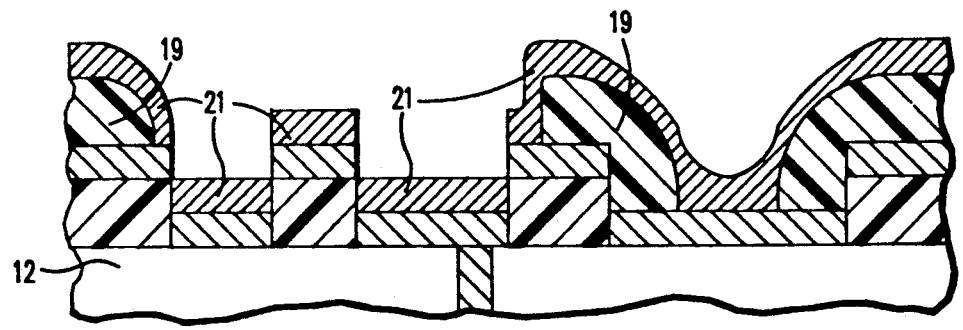

FIG. 4 provides an illustration of the structure after deposition of the interconnection, or via, metallurgy and before polishing.

Figure 5:
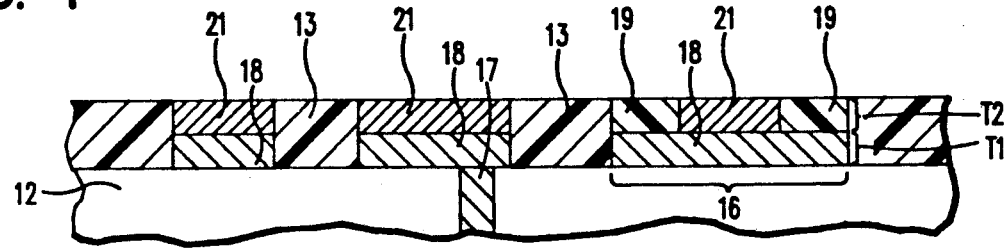

FIG. 5 shows the final structure of a level made in accordance with the subject invention and comprising both the wiring level and interconnection level of metallurgy.

DETAILED DESCRIPTION OF THE INVENTION

Figure 1:
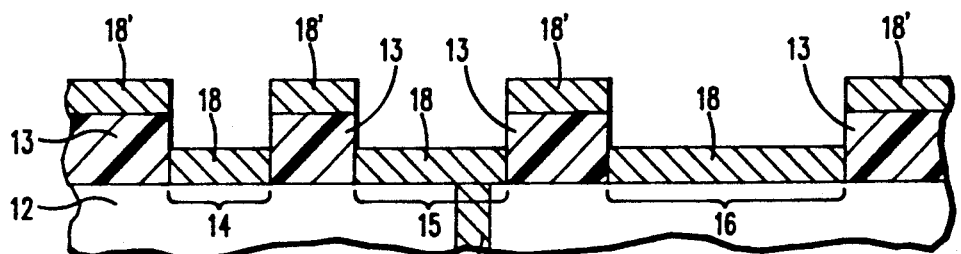
FIG. 1 illustrates the deposition of the first, or the wiring, metallurgy on and about the first patterned polymeric layer.

In accordance with the subject invention, a first layer 13 of FIG. 1, of patternable organic material is deposited on the substrate 12. The substrate may be the underlying inorganic referred to above or a previously deposited metallized organic layer. The organic material must meet the standard for electrical insulation required by the device. In addition, the organic material must be susceptible to patterning and capable of withstanding subsequent metal deposition techniques. A pre-imidized photo-sensitive polyimide is well suited for the needs of this particular invention. The polyimide could be applied by spraying or spinning to achieve a uniform layer as is well known in the semiconductor art. The thickness of the cured layer is to be slightly greater than the sum of T1, the thickness of the wiring layer and T2, the required minimum thickness of insulative material between the wiring layer of one level and that of a next successive level. (T1+T2) is best illustrated in FIG. 5 wherein T1 is the thickness of wiring layer 18 and T2 is the thickness of second organic layer 19 over the underlying wiring layer 18 in area 16. The required minimum thickness of insulative material, T2, between wiring layers in successive layers will be readily determined by one having skill in the art, given the electrical requirements of the final structure and the properties of the materials used. In using the photosensitive polyimides recited above, the total cured thickness of a given level (T1+T2) would be in the range of 10-20 microns. The present inventive method and structure can be utilized with a wide range of materials; therefore, it need not be limited by those dimensions which are recited for completeness herein.

The deposited first layer of organic material, photosensitive polyimide for descriptive purposes is then patterned by exposure through a feature mask. As is well-known in the art, the polymer could be chosen to be either a positive or negative-tone resist, such that the polyimide would be irradiated and then developed by exposure to a solvent capable of dissolving either the irradiated or the non-irradiated portion, respectively. What is needed is that the polymeric material be removed from the substrate surface in those areas where it is desired to deposit metallurgy both to provide wiring and, in places, to contact metallurgy in the underlying substrate. Should a pre-imidized photosensitive polyimide, such as Ciba-Geigy 412, be used, patterning could be accomplished by irradiating the polyimide with a broadband uv exposure and developing the irradiated resist in a developer of gamma-butryl-lactone in xylene for 1-5 minutes. Organic materials, other than polyimide, are envisioned by the invention provided they possess the desired insulative properties for the device; and, provided the material chosen can be readily patterned. Laser ablation is a patterning method which would also be well suited to this invention, given its highly directional quality.

In addition, laser ablation through a dielectric mask provides a patterning means which does not require prolonged exposure of the organic material and underlying substrate to chemical developers or solvents. To one skilled in the art, other methods for obtaining the pattern openings in the polymeric layer may be evident and would not affect the scope of the patent, as the method itself is not critical to the invention.

Once the first polymeric layer 13 is patterned and etched to expose those areas, 14, 15 and 16 of FIG. 1 of the underlying substrate, 12, where wiring metallization is desired, the wiring metallurgy, 18, is deposited. The wiring pattern is dependent upon the requirements for the final product but will presumably be contacting underlying metallurgy in at least one location, such as is illustrated at 17 in FIG. 1. Any appropriate metallurgy can be deposited, again, given the constraints defined by the associated materials; i.e. the underlying substrate or levels and first organic layer of the level presently being fabricated. A useful metallurgy is a Cr-Cu-Cr sandwich wherein the first and last deposited chrome provides superior adhesion to an inorganic substrate, an underlying or subsequently deposited organic layer and other metallurgy. The copper necessarily provides superior conductivity. The method of metal deposition which is preferable is evaporation, given its highly directional quality. What is desired is a vertical profile and planar horizontal surfaces which are free of spikes. Sputtering would be an inappropriate deposition means; but, other known techniques would be appropriate if they provide the vertical, planar profile desired. Wiring layer, 18, will remain in areas 14, 15 and 16 as part of the completed structure. Unlike past methods, though, the excess metal, 18', which has been deposited on the surfaces of patterned polyimide, will not be removed at this stage of fabrication. In fact, the 18' metal atop the polyimide will, in effect, act as a self-alignment mask for further processing.

Figure 2:
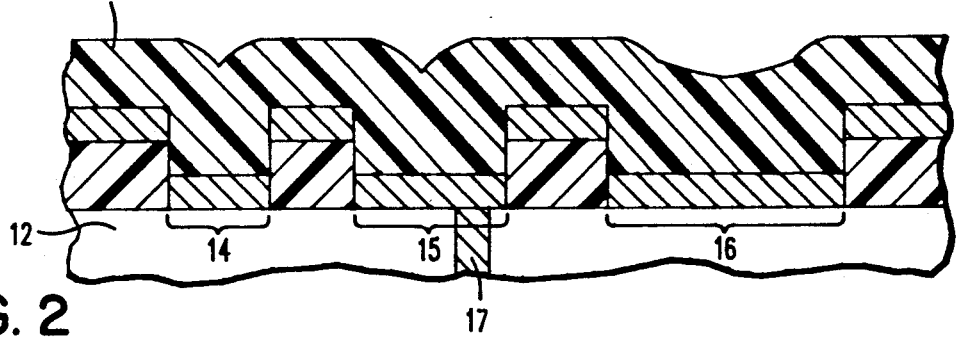
FIG. 2 shows the blanket deposition of a second polymeric layer over the first polymeric layer and first metallurgy deposition.
Figure 3:
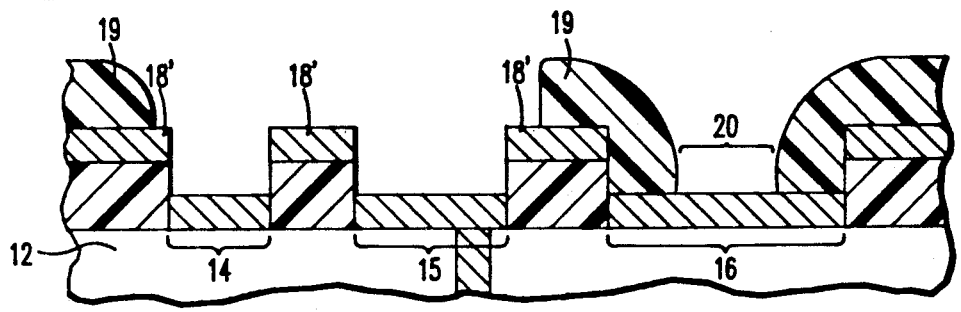
FIG. 3 illustrates the second polymeric layer after patterning.

A second blanket organic layer, 19, of FIG. 2, is now deposited over the wiring layer and the metallurgy-covered, first polyimide pattern, 13. The second organic material may be either the same or a different material from that used in the first organic layer. Deposition techniques for applying the second organic layer can be arbitrarily chosen, such as spinning or spraying as noted above, in order to provide a relatively uniform blanket layer at a thickness sufficient to cover the first organic layer plus the thickness of the overlying wiring metallurgy, 18'. The thickness of layer 19 should, therefore, be equal to or greater than $T_1+T_2$.

Patterning of the second organic layer is the next fabrication step. For the sake of illustration, the following design requirements will be recited: vias are required in areas 14 and 15 having the same widths as the metal lines, 18, of the wiring level; and, a via having the same cross-section as those in areas 14 and 15 is required to contact the wider metal wiring feature (e.g. pad) in area 16. Using these design groundrules, in the past, a detailed mask would be required having each feature, and alignment of the mask to the part would be crucial. However, since the first, wiring metal, 18' has been left on the first organic layer, the second organic layer can be removed in its entirety in those areas, 14 and 15, where vias having the same cross-section as the underlying metal are desired. In essence, therefore, the intermediate structure is self-aligning for the second, via, metallurgy wherever wiring layer and via layer cross-sections are identical. In patterning the second organic layer, therefore, a gross mask is all that is required for many areas. In those areas, such as 16, where the feature in the via layer will have a smaller cross-section than the feature in the underlying wiring layer, alignment is a minor concern given the large target below. A via hole, 20, in the second organic layer, 19, is provided for deposition of the via metallurgy contacting the wiring feature below. There is, in fact, almost a reversal of mask function and a general relaxation of mask requirements, using the subject invention. The mask used to expose the via layer will act essentially as a "block-out" mask in areas 14 and 15, where the target area is small and alignment would otherwise be crucial, and as a "feature" mask in area 16, where the target is large and alignment requirements are less stringent.

Etching of the patterned second organic layer occurs next. It is preferable to use a highly directional etching method, such as $O_2$ reactive ion etch (RIE), to remove the unwanted second organic material. The directional etching is preferable not only for accuracy in the via profiles, 20, but also in order to avoid etching into the first organic layer. As noted above, the first and second organic layers may but need not be, the same material. If differing materials are chosen, the etching constraints for the second material are relaxed, providing the desired via profiles can be obtained. Once again, it is appropriate to note that the highly directional laser ablation technique would be useful here.

Once the second organic material has been removed in all but the desired areas, the via metallurgy may be deposited. The deposition requirements are more relaxed for the via metallurgy, since polishing will occur after this step. However, evaporation is still a preferred method given the uniformity of the deposited layer, and given the fact that the method is not detrimental to the other associated materials. Cr-Cu-Cr is a suitable, preferred metallurgy for the via level as well as the wiring level. It may be advantageous to precede the via metal deposition with an etching step to remove the Cr from the surface, and to minimize resistance at the metal interfaces. The via metallurgy, 21, is deposited to a thickness sufficient to assure connection to the next level after planarization, essentially the same thickness $T_2$ as the minimum insulative thickness between wiring layers in successive levels.

The final step is to planarize the surface of the structure. Machining and/or chemical-mechanical polishing can be employed to remove the excess via metallurgy, second organic layer, and excess wiring layer metallurgy down to the top surface of the via layer metallurgy in areas 14 and 15. If planarization is to be accomplished by machining, the latter must be done in a highly accurate manner. The surface of the via layer metallurgy in areas 14 and 15 should be at the same depth as the top surface of the first organic layer. The resulting structure, illustrated in FIG. 5, comprises one level incorporating a wiring layer and a via layer with associated dielectric material or materials. The above process can be repeated to fabricate successive levels. It may be desired to treat the organics at the top surface of each level in order to promote adhesion of the organic material for the next level. Adhesion within a given level is not a concern, however, given the superior metal-to-organic adhesion, particularly if the preferred Cr and polyimide are utilized. Moreover, within a given level, there are few points of organic-to-organic interface. The structure, therefore, does not suffer from the peeling difficulties of prior art structures. The use of a single organic layer in those areas where fine features are found is unique to the subject invention and is advantageous not only in its elimination of peeling concerns but also in its self-alignment capability. Moreover, with the fabrication of successive levels, the via/interconnection metallurgy need not be increasingly larger to assure capture of the underlying metal features. Therefore, more levels are attainable.

While the invention has been described with reference to a preferred embodiment, it will be understood by those skilled in the art that the foregoing and other changes in methodology and detail may be made without departing from the spirit and scope of the invention.

What is claimed is:

1. A process for fabricating at least one level of semiconductor packaging on a substrate comprising the steps of:
   (a) depositing a layer of first organic material at a predetermined thickness on said substrate;

(b) patterning said first organic layer to provide exposed substrate and remaining first organic material in a predetermined array;

(c) depositing a thickness of first metallurgy on said exposed substrate and said remaining first organic material, said thickness being less than said predetermined thickness for said first organic material;

(d) depositing a thickness of second organic material over said thickness of first metallurgy on said exposed substrate and said remaining first organic material so that said thickness of first metallurgy and said second organic layer are at least equal to said predetermined thickness of first organic material;

(e) patterning said second organic material to selectively expose said first metallurgy;

(f) depositing second metallurgy on said second organic material and said exposed first metallurgy; and (g) planarizing the structure to expose the top surface of said first organic layer.

2. The process of claim 1 wherein said predetermined thickness of first organic material is the sum of the thickness of first metallurgy plus the minimum thickness of second organic material sufficient to provide insulation between said first metallurgy of said produced level and that of an overlying level.

3. The process of claim 1 wherein said substrate is a previously fabricated metallized organic level.

4. The process of claim 1 wherein said patterning of said organic materials comprises laser ablating said materials through a mask.

5. The process of claim 1 wherein said first and second organic materials are photosensitive polymers and wherein said patterning comprises irradiating and developing said polymers.

6. The process of claim 5 wherein said patterning further comprises reactive ion etching said irradiated polymer.

7. The process of claim 1 wherein said depositing of organic materials comprises spraying.

8. The process of claim 1 wherein depositing of said organic materials comprises spinning.

9. The process of claim 1 wherein deposition of said metallurgy comprises evaporating.

10. The process of claim 1 wherein said planarizing comprises etching said second metallurgy, second organic and said first metallurgy remaining on said first organic material by chemical-mechanical polishing.

* * * * *